(12) United States Patent
Krebs et al.

(10) Patent No.: US 9,570,679 B2
(45) Date of Patent: Feb. 14, 2017

(54) NANODEVICE ASSEMBLIES

(71) Applicant: GLOBALFOUNDRIES INC., Grand Cayman (KY)

(72) Inventors: Daniel Krebs, Zurich (CH); Gabriele Raino, Zurich (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 102 days.

(21) Appl. No.: 14/333,841

(22) Filed: Jul. 17, 2014

(65) Prior Publication Data

US 2015/0060755 A1 Mar. 5, 2015

(30) Foreign Application Priority Data

Aug. 27, 2013 (GB) .................................. 1315193.1

(51) Int. Cl.
*H01L 45/00* (2006.01)
*H01L 27/24* (2006.01)

(52) U.S. Cl.
CPC ....... *H01L 45/1293* (2013.01); *H01L 27/2463* (2013.01); *H01L 45/06* (2013.01); *Y10S 977/774* (2013.01)

(58) Field of Classification Search
CPC ... H01L 45/1293; H01L 45/06; H01L 27/2463
USPC .......................................................... 257/5
See application file for complete search history.

(56) References Cited

U.S. PATENT DOCUMENTS

| 7,508,110 | B2 * | 3/2009 | Chen ....................... H01J 45/00 136/206 |
| 7,714,315 | B2 | 5/2010 | Happ et al. | |
| 8,076,569 | B2 * | 12/2011 | Greiff ...................... H02S 10/30 136/200 |
| 8,378,328 | B2 | 2/2013 | Breitwisch et al. | |
| 8,379,438 | B2 | 2/2013 | Tio Castro et al. | |
| 8,929,698 | B2 * | 1/2015 | Peng ....................... G11B 5/314 216/24 |
| 2004/0131102 | A1 * | 7/2004 | Jette ........................ B82Y 20/00 372/97 |

(Continued)

FOREIGN PATENT DOCUMENTS

| WO | 2010107720 A2 | 9/2010 |
| WO | 2010107720 A3 | 9/2010 |

(Continued)

OTHER PUBLICATIONS

N. Ocelic & R. Hillenbrand, Subwavelength-scale tailoring of surface phonon polaritons by focused ion-beam implantation, Nature Materials, vol. 3, pp. 606-609, Sep. 2004.*

(Continued)

*Primary Examiner* — Victoria K Hall
(74) *Attorney, Agent, or Firm* — Scully Scott Murphy and Presser; Frank Digiglio

(57) ABSTRACT

A semiconductor structure is described containing a deflector between a first nanoscale device and a second nanoscale device. The deflector is designed to deflect near-field radiation from emanating from the first nanoscale device to the second nanoscale device. In some embodiments, this may be accomplished using at least one nanoscale element located between the first and second nanoscale device, where the nanoscale element is tuned to the proper plasmon-polariton frequency to deflect the near field radiation.

19 Claims, 4 Drawing Sheets

(56) References Cited

U.S. PATENT DOCUMENTS

| | | | |
|---|---|---|---|
| 2005/0247337 A1* | 11/2005 | Chen | H01J 45/00 136/205 |
| 2007/0099377 A1 | 5/2007 | Happ et al. | |
| 2007/0181932 A1* | 8/2007 | Happ | H01L 27/2436 257/314 |
| 2008/0029158 A1* | 2/2008 | Park | B01L 3/502738 137/76 |
| 2008/0271778 A1* | 11/2008 | Defries | B82Y 20/00 136/252 |
| 2010/0021104 A1 | 1/2010 | Yamagiwa et al. | |
| 2010/0031990 A1 | 2/2010 | Francoeur et al. | |
| 2010/0048020 A1* | 2/2010 | Schrott | H01L 27/2409 438/692 |
| 2010/0270527 A1* | 10/2010 | Sawamura | H01L 27/2463 257/2 |
| 2010/0288352 A1* | 11/2010 | Ji | H01L 31/0549 136/256 |
| 2010/0288993 A1 | 11/2010 | Rho | |
| 2011/0204231 A1* | 8/2011 | Razansky | G01J 5/08 250/338.1 |
| 2011/0266516 A1 | 11/2011 | Park | |
| 2012/0207654 A1* | 8/2012 | Lee | G01N 21/07 422/506 |
| 2013/0033972 A1* | 2/2013 | Hara | G11B 5/314 369/13.33 |
| 2013/0061605 A1* | 3/2013 | de Rochemont | F25B 21/02 62/3.5 |
| 2014/0151678 A1* | 6/2014 | Sakuma | H01L 51/5271 257/40 |
| 2014/0151729 A1* | 6/2014 | Orsley | H01L 33/504 257/98 |
| 2014/0218867 A1* | 8/2014 | Kim | H05K 9/0088 361/704 |
| 2014/0252305 A1* | 9/2014 | Tanielian | H01L 31/02 257/9 |
| 2015/0011029 A1* | 1/2015 | Mangum | C09K 11/883 438/22 |
| 2015/0236222 A1* | 8/2015 | Kurtin | H01L 33/502 257/13 |
| 2016/0298882 A1* | 10/2016 | Chen | H01L 35/32 |

FOREIGN PATENT DOCUMENTS

| | | | | |
|---|---|---|---|---|
| WO | 2013062220 A1 | 5/2013 | | |
| WO | 2013159075 A1 | 10/2013 | | |
| WO | WO 2013/159075 | * | 10/2013 | F28D 15/00 |
| WO | WO 2013159075 | * | 10/2013 | F28D 15/00 |

OTHER PUBLICATIONS

D. Kuo & Y. Chang, Thermoelectric and thermal rectification properties of quantum dot junctions, Physical Review B. vol. 81, No. 205321, May 26, 2010.*

G. Giuliani & J. Quinn, Charge-Density Excitations at the Surface of a Semiconductor Superlattice: A New Type of Surface Polariton, Physical Review Letters, vol. 51, No. 10, pp. 919-922, Sep. 5, 1983.*

S. Basu & M. Francoeur, Near-field radiative transfer based thermal rectification using doped silicon, Applied Physics Letters, vol. 98, No. 113106, Mar. 15, 2011.*

J. Shi et al., Tuning near field radiation by doped silicon, Applied Physics Letters, vol. 102, No. 183114, May 9, 2013.*

S. Shen et al., Surface Phonon Polaritons Mediated Energy Transfer between Nanoscale Gaps, Nano Letters, vol. 9, No. 8, pp. 2909-2913, Jul. 2, 2009.*

P. Hopkins et al. Controlling thermal conductance through quantum dot roughening at interfaces, Physical Review B, vol. 84, No. 035438, Jul. 27, 2011.*

C. Fu & Z. Zhang, Nanoscale radiation heat transfer for silicon at different doping levels, International Journal of Heat and Mass Transfer, vol. 49, pp. 1703-1718 (2006) available online Dec. 20, 2005.*

J. Mulet et al., Enhanced Radiative Heat Transfer at Nanometric Distances, Microscale Thermophysical Engineering, vol. 6, pp. 209-220, 2002.*

Basu et al., "Review of near-field thermal radiation and its application to energy conversion", International Journal of Energy Research, vol. 33, pp. 1203-1232, (2009).

Cerdonio et al., "Thermoelastic effects at low temperatures and quantum limits in displacement measurements", Physical Review D, vol. 63, pp. 082003-1-082003-9, (2001).

Chapuis et al., "Heat transfer between a nano-tip and a surface", Nanotechnology, vol. 17, No. 12, pp. 2978-2981, (2006).

Cook, "Electron Energy Loss Spectra of GeTe—SnTe Alloys", Philosophical Magazine, 24:192, pp. 1347-1353, (1971).

Ivanda et al., "Raman light-to-vibration coupling coefficient of v-SiO2 in spectral interval range up to 600 cm-1", Solid State Communications, vol. 117, pp. 423-428, (2001).

Loomis et al., "Theory of heat transfer by evanescent electromagnetic waves", Physical Review B, vol. 50, No. 24, Dec. 15, 1994, pp. 18 517-18 524.

Luther et al, "Localized surface plasmon resonances arising from free carriers in doped quantum dots", Nature Materials, vol. 10, May 2011, pp. 361-366.

Narayanaswamy et al., "Thermal near-field radiative transfer between two spheres", Physical Review B 77, pp. 075125-1-075125-12, (2008).

Pendry, "Radiative Exchange of Heat Between Nanostructures", Journal of Physics: Condensed Matter, vol. 11, pp. 6621-6633, (1999).

Shen et al., "Surface Phonon Polaritons Mediated Energy Transfer between Nanoscale Gaps", Nano Letter, vol. 9, No. 8, pp. 2909-2913, (2009).

Solis Jr. et al., "Electromagnetic Energy Transport in Nanoparticle Chains via Dark Plasmon Modes", Nano Letters, vol. 12, pp. 1349-1353, (2012).

Sosso et al., "Thermal transport in phase-change materials from atomistic simulations", Physical Review B 86, pp. 104301-1-104301-5, (2012).

Great Britain Search Report, Application No. GB1315193.1, Date of Search: Jan. 9, 2014.

GB Application No. 1315193.1, filed on Aug. 27, 2013, entitled: "Nanodevice Assemblies".

* cited by examiner

NANODEVICE ASSEMBLIES

BACKGROUND

This invention relates generally to nanodevice assemblies, and more particularly to apparatus having a plurality of nanodevices arranged with nanoscale spacing.

The fabrication of device assemblies such as integrated circuits is continually evolving with a view to reducing dimensions and improving performance. Modern computer chips are typically fabricated using semiconductor "nanodevices", i.e. devices which have at least one dimension on the nanoscale (from a fraction of a nanometer up to hundreds of nanometers).

Nanodevices in integrated circuits generally warm up during operation. Since such devices typically have strongly temperature-dependent behavior, this can be detrimental to performance. Memory cells provide a particular example of such nanodevices. A typical memory chip comprises one or more integrated arrays of memory cells arranged in rows and columns. It is important to ensure that heat generated by individual cells cannot disturb the state of neighboring cells and so cause data errors on readback. This "thermal disturb" issue is particularly problematical where active heating of cells is fundamental to cell operation. In phase-change memory (PCM) for example, a cell can be set to different resistive states, representing different stored information, by heating a volume of chalcogenide material in the cell to different temperatures. The chalcogenide can be set to one or more wholly or partially crystalline states by heating to appropriate temperatures. The chalcogenide can then be reset to an amorphous state by heating to a higher temperature, causing melting of the chalcogenide. For this RESET operation, the active cell volume needs to be heated above a melting temperature of typically about 900 K. The temperature of neighboring cells must, however, remain below the chalcogenide crystallization temperature, typically about 450 K, to avoid thermal disturb. With increasingly higher storage densities, the distance between memory cells will decrease below 20 nm. Tailoring the steep temperature gradients between cells poses one of the main challenges in scaling down PCM technology.

Current measures to counter heating problems in nanodevice assemblies involve either incorporating insulating layers to protect vulnerable devices, or providing conducting channels to convey heat away via thermal conduction. In memory arrays, for instance, layers of thermally insulating material such as $Si_3N_4$ have been incorporated between memory cells, dramatically reducing thermal conduction between neighboring cells.

BRIEF SUMMARY

An embodiment of an aspect of the invention provides apparatus comprising a plurality of nanodevices arranged with nanoscale spacing. The apparatus includes a deflector located between at least one pair of the nanodevices, the deflector being adapted to deflect thermal near-field radiation emanating from one nanodevice of the pair away from the other nanodevice of the pair.

Embodiments of the present invention are predicated on the realization that conventional mechanisms are inadequate for effective thermal protection as feature sizes continue to decrease in nanodevice assemblies. The conventional mechanisms address heat transfer by thermal conduction. However, another heat transfer channel is thermal radiation. At the small dimensions present in the current and future technology nodes, radiative heat transport has to be described using near-field physics. Thermal near-field radiation (as discussed, for example, in "Review of near-field thermal radiation and its application to energy conversion", Basu et al., International Journal of Energy Research 2009; 33:1203-1232) is a complex topic of ongoing research and has not yet been fully explored. In nanodevice assemblies embodying the present invention, a deflector is provided to deflect thermal near-field radiation emanating from one nanodevice away from another nanodevice. This inhibits heat-related performance degradation, such as thermal disturb between neighboring memory cells, due to thermal radiation. Embodiments of the invention thus offer improved thermal protection in nanodevice assemblies even as feature sizes continue to decrease with future technology nodes. Embodiments of the invention offer particular advantages as the efficiency of heat transport via thermal near-field radiation increases much faster than heat transport via thermal conduction when the distances involved are reduced.

Nanodevice assemblies embodying the invention may in general comprise two or more nanodevices, and the deflector may be located between the nanodevices of each of a plurality of pairs of adjacent nanodevices. The apparatus may, for example, comprise a memory device such as a phase-change memory device, the nanodevices comprising respective memory cells arranged in an array. The deflector may be located between the memory cells of each pair of adjacent memory cells in the array. The deflector for a pair of memory cells can be adapted to deflect thermal near-field radiation emanating from a memory cell of the pair during a RESET operation on that cell.

The deflector may comprise at least one nanoelement and preferably includes a plurality of nanoelements arranged such that the deflector deflects said thermal near-field radiation emanating from a nanodevice in use of the apparatus. The nanoelement preferably contains a discrete region of material having a plasmon-polariton frequency tuned in dependence on the thermal near-field radiation to be deflected. Such a discrete region preferably includes a quantum dot. As another example, the discrete region may comprise a two-dimensional electron gas. The discrete region may comprise a doped semiconductor material, and the plasmon-polariton frequency of such a region may be tuned by appropriate adjustment of the doping level.

In preferred embodiments, the deflector comprises at least one chain of said nanoelements arranged to transport thermal energy due to the thermal near-field radiation via near-field coupling along the chain. The nanoelement chain thus provides an energy pathway, the deflector nanoelements being arranged to deflect the thermal near-field radiation by transporting energy along the pathway.

The plasmon-polariton frequency of one or more nanoelements in the deflector is preferably tuned on resonance to the thermal near-field radiation emanating from a nanodevice for an efficient energy transfer process. In some embodiments, all nanoelements could be tuned for resonance in this way. However, the tuning of different nanoelements can be varied in preferred embodiments to promote energy transfer away from the nanodevices. In particular, where the deflector comprises a chain of nanoelements, at least one nanoelement proximal the radiating nanodevice can be tuned on resonance for efficient resonant energy transfer. However, the plasmon-polariton frequencies of nanoelements successively further along the chain are preferably tuned to progressively lower frequencies. Thus nanoelements are progressively detuned towards lower energies along the chain. This provides a strong energy transport pathway, leading to a lower, and hence more favorable, energy state of the system. Nanoelements successively further along the chain may be of progressively larger size to provide the progressive detuning. Alternatively, for example, nanoelements of semiconductor material may have progressively lower doping levels along the chain.

The deflector between a pair of nanodevices can be arranged to deflect thermal near-field radiation emanating from either nanodevice of the pair away from the other nanodevice of the pair, particularly when the two nanodevices are alike.

BRIEF DESCRIPTION OF THE SEVERAL DRAWINGS

Preferred embodiments of the invention will now be described, by way of example, with reference to the accompanying drawings in which.

Figure 1:
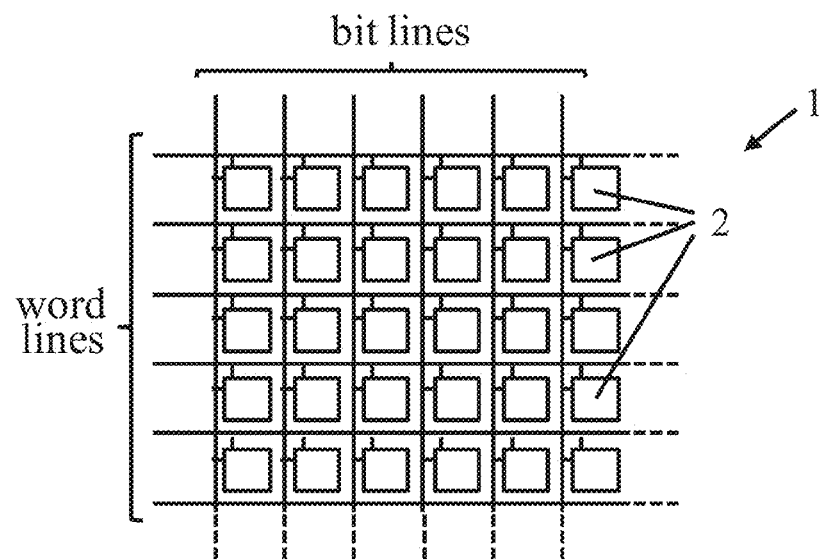
FIG. 1 is a schematic representation of a memory array, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1 is a schematic illustration of a memory device 1 in which embodiments of the invention can be employed. The memory device 1 comprises an integrated array of phase change memory (PCM) cells 2 electrically connected between pairs of word-lines and bit-lines as indicated. Signals supplied to these word and bit lines in operation allow individual PCM cells 2 to be accessed to perform write (programming) and read operations on the PCM cells 2. A memory chip embodying the memory device 1 typically also includes additional circuitry (not shown) for controlling read and write operations in a known manner.

Figure 2:
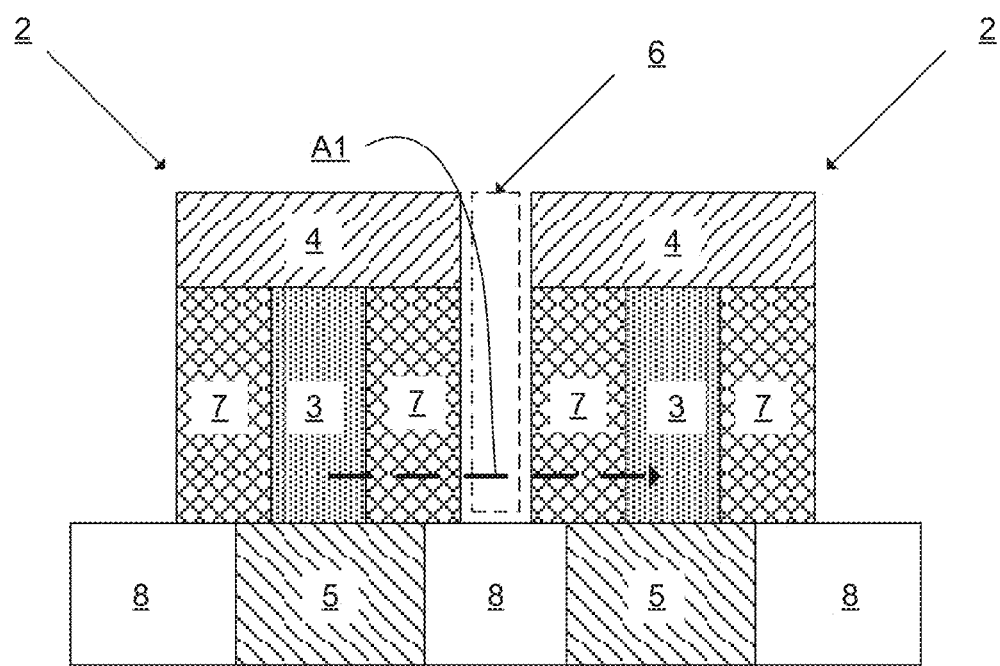
FIG. 2 is a cross-sectional view depicting a pair of adjacent PCM cells in a memory array, according to an exemplary embodiment.

FIG. 2 shows an illustrative example of the structure of a pair of adjacent PCM cells 2 in the memory device 1. This schematic cross-sectional view shows each PCM cell 2 having a volume of chalcogenide layer 3 located between a top electrode 4 and a bottom electrode 5. The bottom electrode 5 is typically connected to one of the word lines (not shown in this figure) formed on a semiconductor substrate (not shown), and the top electrode 4 is typically connected to the bit line (not shown) for the PCM cell 2. In this example, the top electrodes 4 and the bottom electrode 5 are formed of titanium nitride. A silicon nitride layer 7 may be formed sandwiching the chalcogenide layer 3. A silicon nitride base layer 8 may be formed between the bottom electrodes 5 of adjacent PCM cells 2. The silicon nitride layer 7 and silicon nitride base layer 8 may provide both electrical insulation and thermal insulation against transport of heat by thermal conduction. A deflector gap 6 between PCM cells 2 may be filled with insulating material, e.g., silicon oxide or silicon nitride.

The basic structure shown in FIG. 2 can be repeated for each pair of adjacent PCM cells 2 along the rows and columns of the array. At current integration levels, the various dimensions of the PCM cell 2 structure shown are measured on the nanoscale, whereby each PCM cell 2 constitutes a nanodevice. Device dimensions, and the spacing between neighboring PCM cells 2 in the overall nanodevice assembly, continue to decrease with progress through successive technology nodes. As feature sizes progress towards the 20 nm node and beyond, the effect of heat transfer between neighboring PCM cells 2, indicated schematically by a heat transfer arrow $A_1$ in FIG. 2, is increasingly problematical. The high PCM cell 2 temperature required for the RESET operation in particular can cause significant thermal disturb problems, resulting in neighboring PCM cells 2 being heated above the temperature required to alter the programmed PCM cell 2 state. With such nanoscale spacing of PCM cells 2 in the array, PCM cells 2 lie within the near-field region around neighboring PCM cells 2, i.e. the region in which the electromagnetic field around a source object is governed by near-field physics. Heat transport at this scale depends on various factors such as dimensions and geometry of the source, wavelength of the electromagnetic radiation and distance from the source. However, the contribution of thermal radiation, e.g., infrared radiation, to heat transport increases rapidly with decreasing distance in the near-field compared to that of thermal conduction. Thermal near-field radiation emanating from the hot phase-change material of a PCM cell 2 during a RESET process will travel through the surrounding insulating material and will heat up the phase-change material of the neighboring PCM cell 2, exacerbating thermal disturb problems.

Figure 3:
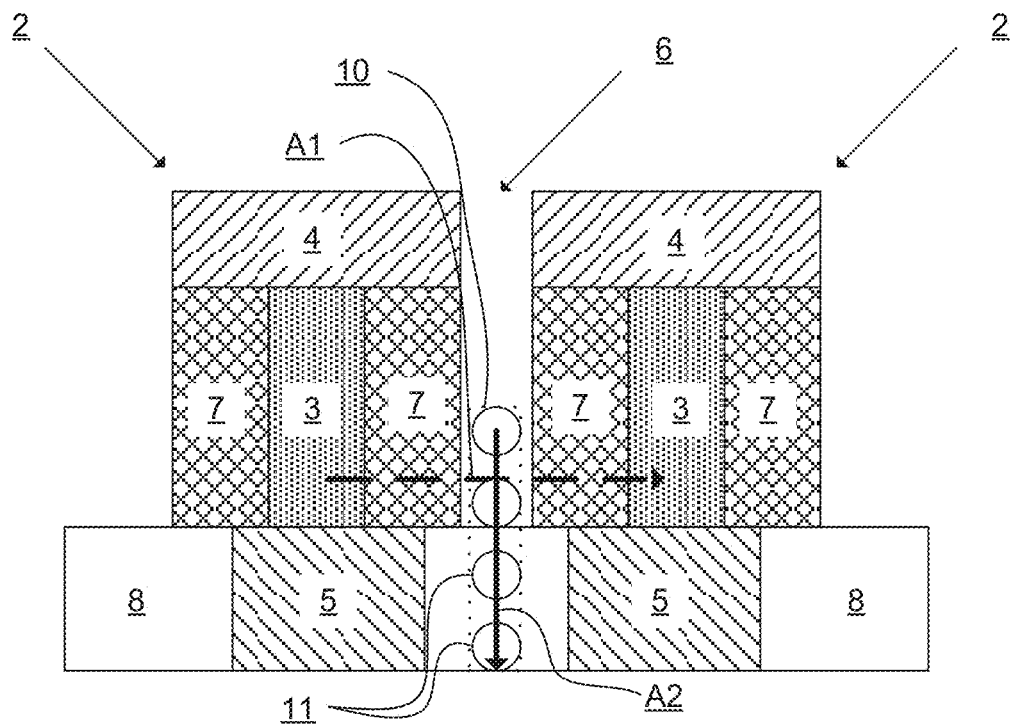
FIG. 3 is a cross-sectional view depicting a pair of adjacent PCM cells in a memory separated by a chain of quantum dots, according to an exemplary embodiment.

FIG. 3 shows the structure of an exemplary pair of PCM cells 2 in the memory device 1 embodying the invention. The PCM cell 2 structure corresponds generally to that of FIG. 2, with like components indicated by like references, and only the difference in structure is described here. A deflector structure, indicated generally at 10, is located in the deflector gap 6 between the pair of PCM cells 2. This deflector 10 is adapted to deflect thermal near-field radiation emanating from either of the PCM cells 2 in operation of the array away from the other PCM cell 2 of the pair. In particular, the deflector 10 is formed by a plurality of nanoelements which are arranged such that the deflector deflects thermal near-field radiation emanating from a PCM cell 2 during a RESET operation. Each of these nanoelements comprises a discrete region of material such as, for example, a quantum dot 11, as represented schematically by the circles in the figure. The quantum dots 11 can be formed of a doped semiconductor material such as, for example, silicon, and are arranged as a chain or series of quantum dots 11. This chain of quantum dots 11 extends, substantially equidistantly between PCM cells 2, from a point proximal each PCM cell 2 downwardly between the PCM cells 2 towards the substrate of the array in this example.

The deflector 10 serves to deflect thermal near-field radiation emanating from the PCM cell 2 by coupling the dipoles generated by the heat to the plasmon-polaritons in the quantum dotvia dipole-dipole interaction. The transport of thermal near-field radiation from one PCM cell 2 to the neighboring PCM cell 2 can also be described in the most basic terms as a dipole-dipole interaction. Since the PCM cells 2 are at different temperatures and the materials within the PCMcells 2 have strongly temperature dependent properties, the resonant frequencies of these dipoles are not in tune. The deflector 10 exploits this fact, providing a system with a more suitable resonant frequency and hence a more efficient energy transfer channel. In particular, near-field coupling of thermal radiation emanating from the PCM cell 2 with the chain of quantum dots 11 excites surface plasmon-polaritons in the quantum dots 11. The frequency of these plasmon-polaritons can be tuned based on the thermal radiation to be deflected to provide more efficient energy transfer to the quantum dots 11 than to the neighboring PCM cell 2. Ideally the plasmon-polaritons are tuned based on resonance to the thermal near-field radiation emitted from a PCM cell 2 during RESET, thus providing resonant energy transfer to the deflector via a dipole-dipole coupling, and significantly reducing energy transfer to the neighboring PCM cell 2. Typically a spectrum of thermal near-field radiation is emitted by a PCM cell 2, thus the plasmon-polariton frequency can be tuned to a frequency corresponding to a maximum of this spectrum as determined for a given PCM cell 2 system. The arrangement of quantum dots 11 in a chain allows the thermal energy to be transported along the chain in accordance with similar principles to those described for chains of gold nanoparticles in "Electromagnetic Energy Transport in Nanoparticle Chains via Dark Plasmon Modes", Solis et al., Nanoletters 2012, 12, 1349-1353. The spacing of adjacent quantum dots 11 in the chain is such that adjacent quantum dots 11 are coupled in the near-field, permitting transport of the thermal radiation along the chain and away from the neighboring PCM cell 2. The deflector 10 thus provides an energy transport pathway, indicated by the bold arrow A2 in FIG. 3, for deflecting the thermal near-field radiation away from the neighboring PCM cell 2. This reduces thermal energy transfer to the neighboring PCM cell 2, indicated by the dotted arrow A1, and thus inhibits thermal disturb.

The plasmon-polariton frequency of the quantum dots 11 can be tuned to the required resonant frequency using known principles as described in "Localized surface plasmon resonances arising from free carriers in doped quantum dots", Luther et al., Nature Materials Vol. 10, May 2011. This demonstrates (see for instance FIG. 1 of the paper) that the frequency of localized surface plasmon resonances (which corresponds to the plasmon-polariton frequency referred to herein) in semiconductor quantum dots can be tuned by adjusting the doping level (number of free carriers) in the quantum dots 11. The plasmon-polariton frequency also varies with quantum dot size as indicated in this reference. Suitable dot size and doping levels in the FIG. 3 structure will depend on the particular implementation, e.g., materials, dimensions, arrangement and operating characteristics of the PCM cells 2 as well as the material of the quantum dots 11. However, appropriate parameters for a given system can be readily determined based on the principles described.

Though represented schematically by four circles in FIG. 3, in practice the chain can be formed of a sufficient number of quantum dots 11 to provide a pathway of adequate dimensions to transport radiative thermal energy away from the neighboring PCM cell 2 as required. Moreover, depending on factors such as quantum dot 11 size and PCM cell 2 feature sizes, the deflector 10 may be formed by more than one chain of quantum dots 11. These might be closely packed to form a line, or plural chains might be distributed laterally (i.e. in a direction perpendicular to the page in FIG. 3) effectively forming a layer arrangement of chains (or lines of chains) between neighboring PCM cells 2. Such a layer may extend at least partially around a PCM cell 2 between one or more neighboring PCM cells 2 as deemed appropriate for a given cell/array structure. However, since active heating of PCM cells 2 is fundamental to PCM operation, it is also important to consider the trade-off between (1) the applied power required to achieve PCM cell 2 RESET and (2) the desired objective of lowering neighboring PCM cell 2 temperature in this process, in the presence of the deflector 10. This is explained below with reference to FIGS. 4 to 5b.

Figure 4:
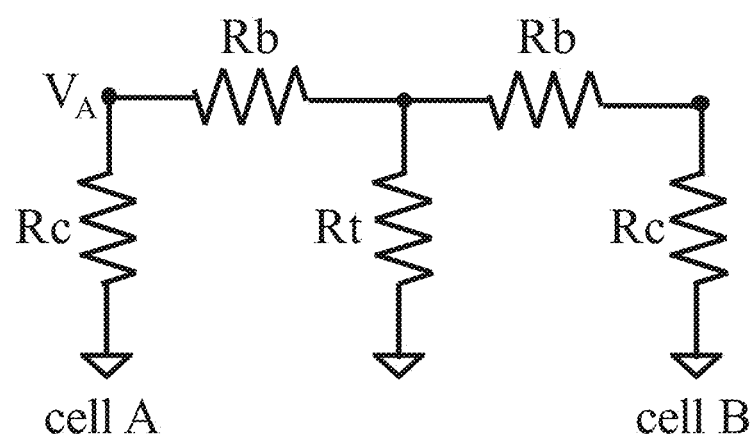
FIG. 4 shows an equivalent thermal network for the cell pair of FIG. 3.
Figure 5A:
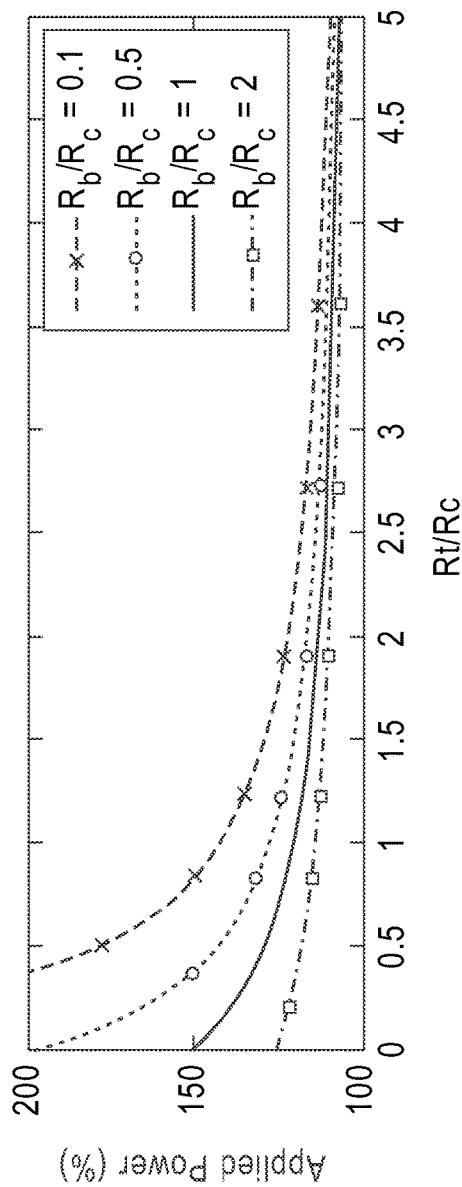
FIG. 5a is a graph illustrating the trade-off between thermal disturb temperature and input power for different parameter values in the FIG. 4 network.
Figure 5B:
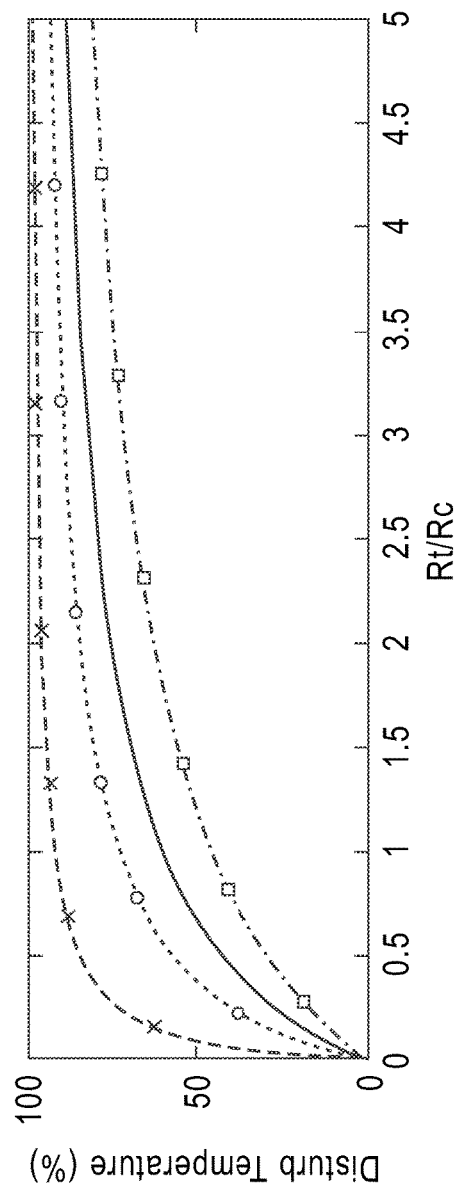
FIG. 5b is a graph illustrating the trade-off between thermal disturb temperature and input power for different parameter values in the FIG. 4 network.

FIG. 4 shows an equivalent thermal network for the cell-pair of FIG. 3. Rt represents thermal resistance of the deflector 10, Rc represent thermal resistance of a PCM cell 2, and Rb represents thermal resistance of the intervening structure. Power is applied to reset the left-hand cell, cell A, resulting in a temperature corresponding to a voltage VA in the equivalent thermal network as indicated. For a given ratio Rb/Rc, the resulting temperature attained at cell B (the "disturb temperature") decreases as the thermal resistance Rt of deflector 10 decreases relative to Rc. However, the programming temperature attained in cell A increases as Rt/Rc decreases. As Rt/Rc decreases, therefore, more power must be applied to RESET cell A. FIG. 5a plots the required reset power (as a percentage of its value without deflector 10), against Rt/Rc for different Rb/Rc ratios based on the FIG. 4 network. FIG. 5b plots the corresponding disturb temperature (again as a percentage of its value without deflector 10) against Rt/Rc for the same Rb/Rc ratios. It can be seen that, for a given Rb/Rc ratio, there is a trade-off between the achievable reduction in disturb temperature and the necessary increase in RESET power. However, these figures clearly demonstrate that beneficial conditions are achievable for workable parameter sets. For example, with a reasonable Rb/Rc ratio of 1 and Rt/Rc=1, it can be seen that the disturb temperature can be reduced by nearly 50% for an increase in applied power of only about 20%. Hence, the arrangement of the quantum dots 11 forming the deflector 10 can be adapted appropriately, e.g., by appropriate selection of material, dimensions, etc., to achieve a thermal resistance giving the desired trade-off for a given PCM cell 2 system.

The quantum dots 11 can be formed by a variety of known techniques and can be incorporated in the fabrication process for the PCM cell 2 in any convenient manner. The PCM cell 2 structures vary widely, and can be fabricated in different ways using various processing techniques. Different techniques for fabricating the chains of quantum dots 11 between the PCM cells 2 may therefore be appropriate to different structures. In the FIG. 3 arrangement, for example, the basic structure of the PCM cell 2 may be formed initially with an air gap in the deflector gap 6 between the PCM cells 2. The deflector 10 may then be fabricated by depositing the quantum dots 11 in the deflector gap 6. Depending on construction of the quantum dots 11 and the desired characteristics of the chain in accordance with principles described earlier, the quantum dots 11 may be deposited with intervening spacers, such as thin material layers, e.g., of oxide, to progressively build up the deflector 10 in the deflector gap 6. However, spacers between successive quantum dots 11 may not be required in some cases, or such spacers may be attached to the quantum dots 11 themselves as a result of the quantum dot 11 formation process. The quantum dots 11 may, for instance, have organic ligands attached to their surface, thus providing the anchor for attachment of the polymer chains. The length of such chains can be controlled in known manner by the chemistry. The polymer chains around the quantum dot 11 then serve as spacers when the quantum dots 11 are deposited in the region between the PCM cells 2. Other techniques can be envisaged however. For example, some cell designs may lend themselves to formation of quantum dots 11 on a surface of the structure during fabrication. In general, any convenient fabrication steps can be employed to achieve a deflector having appropriate characteristics as described above, and suitable methods for a given PCM cell 2 design will be apparent to those skilled in the art.

Figure 6:
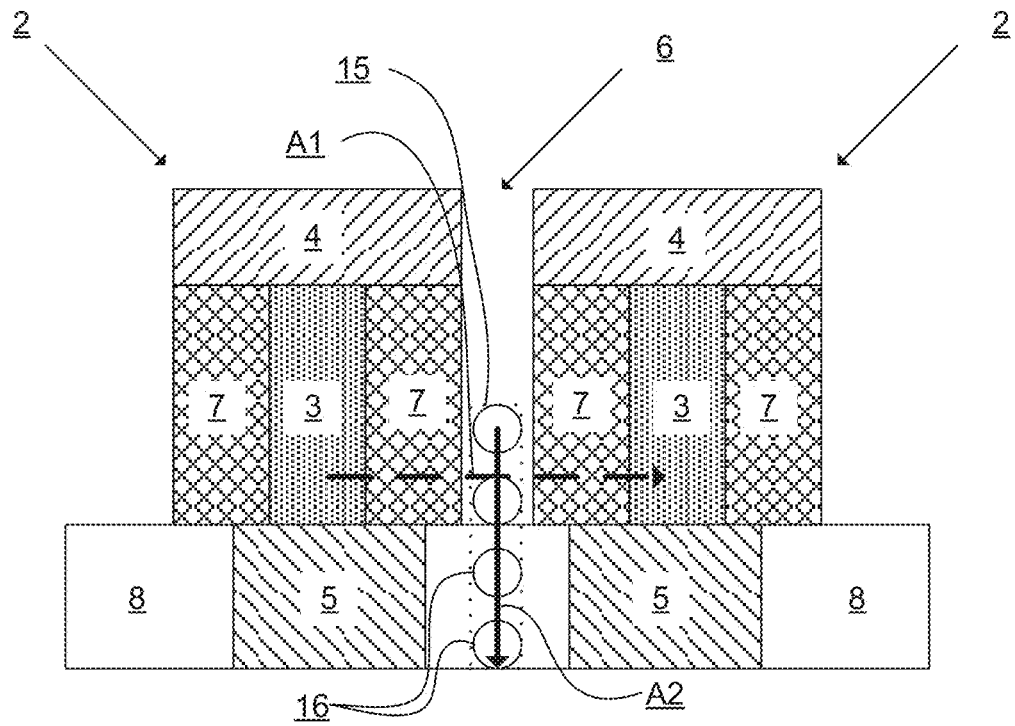
FIG. 6 is a cross-sectional view depicting a pair of adjacent PCM cells in a memory separated by a chain of quantum dots, according to an exemplary embodiment.

FIG. 6 illustrates an additional embodiment to the deflector in a preferred embodiment of the invention. The deflector 15 of this embodiment is again formed of a chain of quantum dots 16 arranged to operate generally as described above. Here, however, the plasmon-polariton frequencies of quantum dots 16 at different positions along the chain are tuned to slightly different frequencies. One or more quantum dots 16 proximal to the PCM cells 2 are tuned based on the thermal radiation as before. However, the plasmon-polariton frequencies of the quantum dots 16 successively further along the chain, as indicated schematically by energy transport pathway $A_2$, are tuned to progressively lower frequencies. In this example, the silicon dots have progressively lower doping levels along the chain, as indicated schematically by energy transport pathway $A_2$, to provide the progressive frequency variation. Thus, while successive quantum dots 16 are still coupled in the near-field for transport of thermal radiation along the chain as before, the quantum dots 16 are progressively detuned towards lower energies along the chain. This provides a stronger energy transport pathway along the chain in that it leads to a more favorable, lower energy state of the system.

The deflector 15 can be fabricated with the PCM cell 2 structure generally as described above, with the doping of the quantum dots 16 deposited at successive positions along the deflector being varied accordingly. As an alternative (or in addition) to varying doping levels along the chain, quantum dots 16 successively further along the chain (in a direction away from the PCM cells 2) may be of progressively larger size to provide the progressive detuning effect. In either case, embodiments might be envisaged where dot chains forming the deflector extend both upwardly and downwardly relative to PCM cells 2. In this case the progressive frequency variation might be bidirectional, moving away from the PCM cells 2 in both directions.

Figure 7:
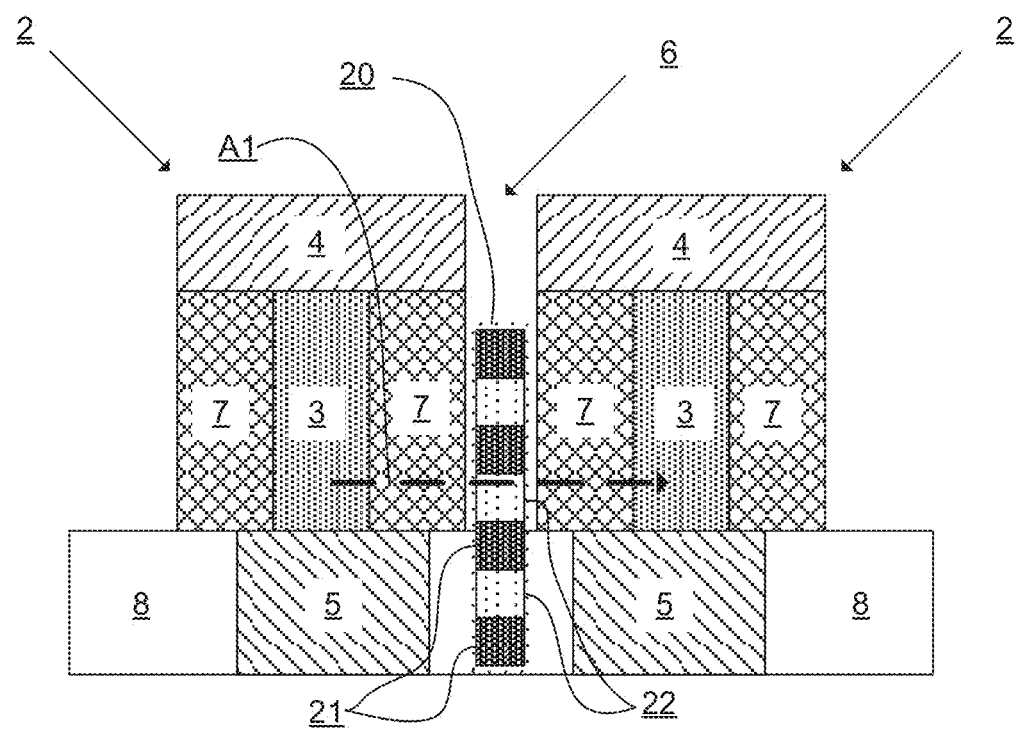
FIG. 7 is a cross-sectional view depicting a pair of adjacent PCM cells in a memory separated by a chain of nanoelements, according to an exemplary embodiment.

FIG. 7 illustrates another exemplary embodiment where the deflector 20 comprises a chain of nanoelements 21 each of which comprises a two-dimensional electron gas. The nanoelements 21 may be implemented, for example, as thin layers of doped silicon deposited in an alternating pattern with spacer layers 22 such as, for example, silicon oxide. Free carriers in the thin-film may provide the two-dimensional electron gas, and can support surface plasmon-polariton resonances as previously described. The plasmon-polariton frequency of these nanoelements may thus be tuned by varying the doping level as for the embodiments of FIGS. 3 and 6.

Various changes to the above embodiments can be envisaged. The quantum dots might be formed of doped semiconductor materials other than silicon or silicon compounds. Moreover, nanoelements might be formed of dots or nanoparticles of any other materials permitting appropriate tuning of plasmon-polariton frequencies. Depending on feature sizes, a single nanoelement, e.g., a single quantum dot, may be sufficient to form the deflector in some instances. Various other deflector structures might also be envisaged. Nanoelements may, for instance, have various different shapes and arrangements, and the deflector may exploit features other than quantum dots or two-dimensional electron gas elements as in the particular examples described.

While the above embodiments address deflection of thermal near-field radiation during RESET of PCM cells 2, similar principles can of course be applied to deflect any thermal near-field radiation emanating from any type of nanodevice in a nanodevice assembly. Moreover, the thermal resistance constraints discussed in relation to FIGS. 4 to 5b above need not be considered if active heating of nanodevices is not required for operation. In some embodiments, deflectors might be adapted to deflect a broader spectrum of thermal near-field radiation, e.g., by incorporating chains of quantum dots tuned to different resonant frequencies, in the deflector structure. Deflectors can therefore be adapted as required for a particular nanodevice or application in accordance with the general principles described above. Of course, while one deflector serves to protect both PCM cells 2 in the quantum dot embodiments above, in other assemblies where neighboring nanodevices are not alike a deflector may be provided for each nanodevice to be protected. Conventional thermal conduction mechanisms can of course be employed in conjunction with the thermal near-field radiation deflectors as required.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
    a first nanoscale device;
    a second nanoscale device;
    a deflector located between the first nanoscale device and the second nanoscale device, wherein the deflector comprises at least one nanoelement selected from the group consisting of a quantum dot and a two-dimensional electron gas, the at least one nanoelement configured to deflect thermal near-field radiation emanating from the first nanoscale device to the second nanoscale device.

2. The semiconductor structure of claim 1, wherein the deflector comprises a plurality of nanoelements arranged such that the deflector deflects the thermal near-field radiation.

3. The semiconductor structure of claim 1, wherein the nanoelement comprises a discrete region of material having a plasmon-polariton frequency tuned to deflect the thermal near-field radiation emanating from the first nanoscale device.

4. The semiconductor structure of claim 3 wherein the discrete region comprises a quantum dot.

5. The semiconductor structure of claim 4, wherein the material comprises a doped semiconductor.

6. The semiconductor structure of claim 3, wherein the discrete region comprises a two-dimensional electron gas.

7. The semiconductor structure of claim 3, wherein the deflector comprises at least one chain of nanoelements, wherein the chain of nanoelements is arranged to transport thermal near-field radiation along the chain of nanoelements.

8. The semiconductor structure of claim 7, wherein the at least one chain of nanoelements is tuned to a resonance of the thermal near-field radiation and is proximal to the first nanoscale device, and wherein the plasmon-polariton frequencies of the nanoelements along a heat transfer pathway are tuned to progressively lower frequencies.

9. The semiconductor structure of claim 8, wherein the nanoelements are progressively larger in size along a heat transfer pathway.

10. The semiconductor structure of claim 7, wherein the nanoelements have progressively lower doping levels along a heat transfer pathway.

11. The semiconductor structure of claim 3, wherein the plasmon-polariton frequency of at least one nanoelement is tuned to a resonance of the thermal near-field radiation emanating from the first nanoscale device.

12. The semiconductor structure of claim 1, wherein the first nanoscale device and the second nanoscale device are the same type of device.

13. The semiconductor structure of claim 1, wherein the first nanoscale device and the second nanoscale device comprise memory cells arranged in an array, wherein the deflector is located between the memory cells of each pair of adjacent memory cells in the array.

14. The semiconductor structure of claim 13, wherein each nanoscale device comprises a phase-change memory cell.

15. The semiconductor structure of claim 14, wherein the deflector is adapted to deflect thermal near-field radiation emanating from the phase-change memory cell during a RESET operation.

16. A semiconductor structure comprising:
    a first nanoscale device;
    a second nanoscale device;
    a deflector located between the first nanoscale device and the second nanoscale device, wherein the deflector deflects thermal near-field radiation emanating from the first nanoscale device to the second nanoscale device, the deflector comprising at least one nanoelement comprising a discrete region of material having a plasmon-polariton frequency tuned to deflect the thermal near-field radiation emanating from the first nanoscale device.

17. The semiconductor structure of claim 16 wherein the discrete region comprises one of: a quantum dot; a two-dimensional electron gas; or a doped semiconductor material.

18. The semiconductor structure of claim 16, wherein a plasmon-polariton frequency of at least one nanoelement is tuned to a resonance of the thermal near-field radiation emanating from the first nanoscale device.

19. The semiconductor structure of claim 17, wherein the deflector comprises at least one chain of nanoelements, wherein the chain of nanoelements is arranged to transport thermal near-field radiation along the chain of nanoelements, wherein the at least one chain of nanoelements is tuned to a resonance of the thermal near-field radiation and is proximal to the first nanoscale device, and wherein the plasmon-polariton frequencies of the nanoelements along a heat transfer pathway are tuned to progressively lower frequencies.

* * * * *